United States Patent
Kim et al.

(10) Patent No.: US 10,139,249 B2
(45) Date of Patent: Nov. 27, 2018

(54) METROLOGY SYSTEM AND STAGE CONTROL DEVICE USING THE SAME

(71) Applicant: SAMSUNG ELECTRONICS CO., LTD., Suwon-si, Gyeonggi-do (KR)

(72) Inventors: Hong Won Kim, Seoul (KR); Ho Hyun Lee, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/693,748

(22) Filed: Sep. 1, 2017

(65) Prior Publication Data
US 2018/0106645 A1 Apr. 19, 2018

(30) Foreign Application Priority Data
Oct. 14, 2016 (KR) .................... 10-2016-0133333

(51) Int. Cl.
*G03F 7/20* (2006.01)
*G01D 5/26* (2006.01)

(52) U.S. Cl.
CPC ......... *G01D 5/266* (2013.01); *G03F 7/70691* (2013.01)

(58) Field of Classification Search
CPC .. G03F 7/70483; G03F 7/70491; G01D 5/266
See application file for complete search history.

(56) References Cited

U.S. PATENT DOCUMENTS

| 4,364,086 A | 12/1982 | Guth |
| 7,777,202 B2 | 8/2010 | Satoh et al. |
| 9,051,141 B2 | 6/2015 | Kato |
| 2003/0041447 A1* | 3/2003 | Jacques ................. F16F 15/005 29/739 |
| 2014/0070752 A1* | 3/2014 | Otsuji ...................... G05D 3/20 318/603 |
| 2015/0098074 A1* | 4/2015 | Rosa ................... G03F 7/70775 355/72 |
| 2016/0048087 A1 | 2/2016 | Yang et al. |
| 2017/0212431 A1* | 7/2017 | Van De Wal ....... G03F 7/70725 |

FOREIGN PATENT DOCUMENTS

| JP | 2000-182938 | 6/2000 |
| JP | 2004-158634 | 6/2004 |
| JP | 2015-190826 | 11/2015 |
| KR | 10-2016-0071788 | 6/2016 |

\* cited by examiner

*Primary Examiner* — Jonathan Hansen
(74) *Attorney, Agent, or Firm* — Lee & Morse, P.C.

(57) ABSTRACT

A metrology system includes a timing estimator, a sensor, and a position estimator. The timing estimator receives a control signal transmitted at a first timing of a first control loop and estimates a second timing at which the control signal is transmitted in a second control loop subsequent to the first control loop. The sensor senses position information of a wafer. The position estimator estimates the position information of the wafer at the estimated second timing based on the sensed position information of the wafer and outputs the estimated position information of the wafer based on a position request signal.

20 Claims, 9 Drawing Sheets

METROLOGY SYSTEM AND STAGE CONTROL DEVICE USING THE SAME

CROSS-REFERENCE TO RELATED APPLICATION

Korean Patent Application No. 10-2016-0133333 filed on Oct. 14, 2016, and entitled: "Metrology System and Stage Control Device Using the Same," is incorporated by reference herein in its entirety

BACKGROUND OF THE INVENTION

1. Field

One or more embodiments described herein relate to a metrology system and a stage control device using a metrology system.

2. Description of the Related Art

Efforts have been made to make ultra-miniaturized semiconductor devices. The processes used to make these devices should be implemented with precision. Some processes use a stage to transfer a wafer or glass to a desired position, e.g., exposure and inspection positions. A metrology system may then be used to measure the position of the wafer or glass on the stage. The wafer or glass should be precisely located on the stage and the speed of the stage is to be controlled.

SUMMARY

In accordance with one or more embodiments, a metrology system includes a timing estimator to receive a control signal transmitted at a first timing of a first control loop and to estimate a second timing at which the control signal is transmitted in a second control loop subsequent to the first control loop; a sensor to sense position information of a wafer; and a position estimator to estimate the position information of the wafer at the estimated second timing based on the sensed position information of the wafer and to output the estimated position information of the wafer based on a position request signal.

In accordance with one or more other embodiments, a stage control device includes a sensor to sense a position of a wafer on a stage and to transmit sensed position information in a synchronous communication mode; a controller including a control signal transmitter to transmit a first control signal at a first timing within a first control loop and a second control signal at a second timing within a second control loop subsequent to the first control loop; a timing estimator to receive the first control signal and estimate the second timing at which the second signal is transmitted to transmit an estimation signal at the estimated second timing; and a position estimator to receive the sensed position information from the sensor and estimate the position of the wafer at the second timing based on the estimation signal and provide the estimated position information to the controller, wherein the controller is to control the stage based on the estimated position information.

In accordance with one or more other embodiments, a system includes first logic to receive a control signal transmitted at a first timing of a first control loop and to estimate a second timing at which the control signal is transmitted in a second control loop subsequent to the first control loop; and second logic to estimate a position information of a wafer at the estimated second timing based on sensed position information of the wafer, the second logic to output the estimated position information based on a position request signal.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
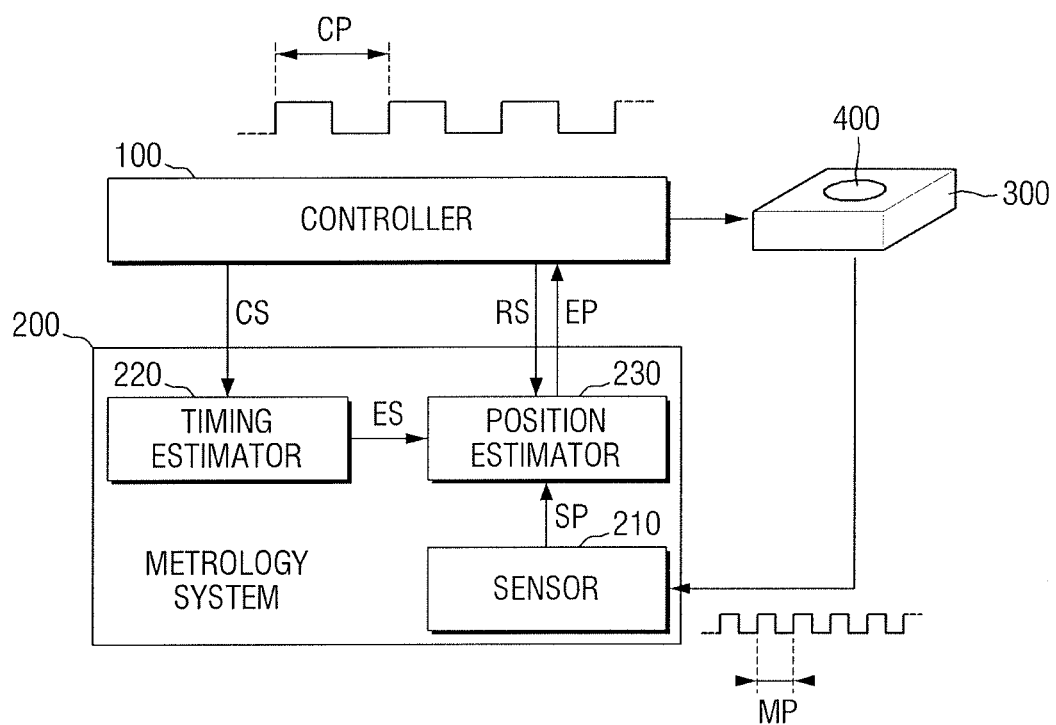
FIG. 1 illustrates an embodiment of a metrology system.

FIG. 1 illustrates an embodiment of a metrology system 200 which includes a sensor 210, a timing estimator 220, and a position estimator 230. The metrology system 200 may be a system that provides position information of a wafer 400 on a stage 300. For example, the metrology system 200 may be a system that senses the position of the wafer 400 on the stage 300 and provides information indicating the position of the wafer 400 on the stage 300 based on a control signal CS from the controller 100.

In one embodiment, the metrology system 200 may estimate the timing at which the control signal CS is transmitted based on the control signal CS transmitted from one or more control loops of the controller 100, estimates the position information of the wafer 400 at the estimated timing, and provides the estimated position information EP to the controller 100.

The controller 100 may control the stage 300 for each control loop based on the position information at the timing of transmitting the control signal CS.

The sensor 210 may sense the position of the wafer 400 on the stage 300 and provides the sensed position information SP to the position estimator 230. The sensor 210 may be, for example, a laser interferometer. The sensor 210 may sense the position of the wafer 400 at a sensing period MP which is shorter than the control period CP of the controller 100. For example, when the controller 100 controls the stage 300 at a frequency of 10 KHz, the sensor 210 may sense the position of the wafer 400 at a frequency of 10 MHz.

In some embodiments, the sensor 210 may transmit the sensed position information SP to the position estimator 230 in a synchronous communication mode. The synchronous communication mode may refer, for example, to a mode to transmit and receive data in synchronization with a constant clock signal in the data communication. An asynchronous communication mode may refer, for example, to a transmission mode that does not require maintenance of a time relation between the transmitting and receiving sides and performs synchronization each time at the starting point of data (e.g., frame) received by the receiving side. Thus, the synchronous communication mode may have a transfer speed and transmission efficiency greater than in the asynchronous communication mode. The asynchronous communication mode may be easily achieved and less expensive compared to the synchronous communication mode.

In one embodiment, the sensed position information SP may be transmitted to the position estimator 230 in synchronization with a constant clock signal. Thus, the sensed position information SP may be transmitted with a high speed transfer rate and high transmission efficiency. In one embodiment, the sensor 210 may also transmit the sensed position information SP in asynchronous communication mode.

The timing estimator 220 may estimate the timing of the control signal CS transmitted from each control loop of the controller 100. For example, the timing estimator 220 may estimate the timing of the control signal of the next control loop based on the control signal CS from the specific control loop of the controller 100, and may provide the estimation signal ES to the position estimator 230 at the estimated timing. The control signal CS may be transmitted by the controller 100 at a specific timing of each control loop.

Figure 2:
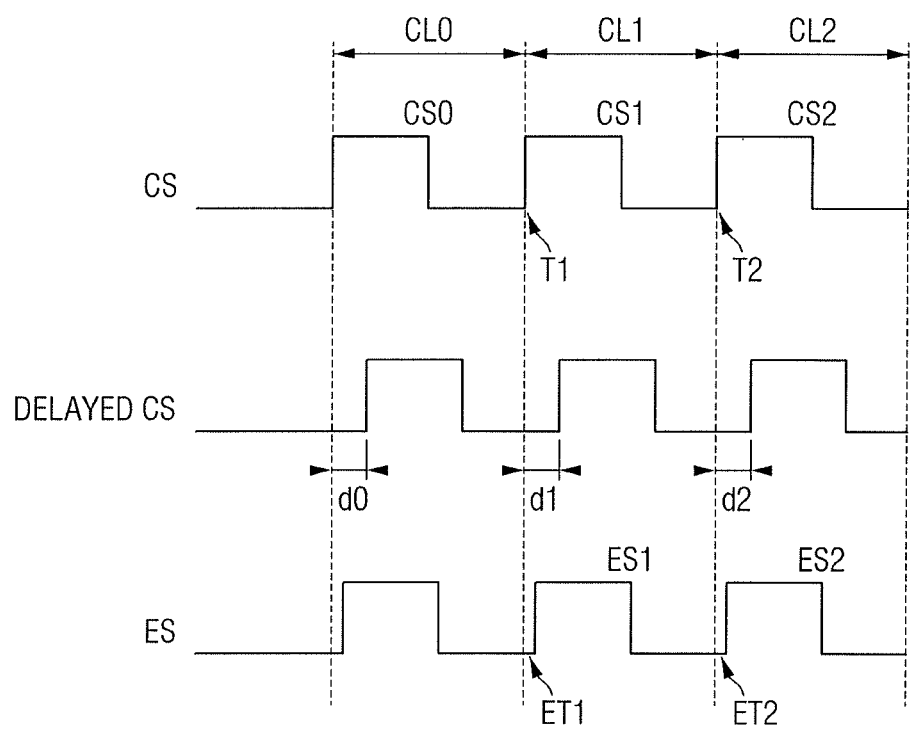
FIG. 2 illustrates an embodiment of a timing estimator.

Referring to FIG. 2, the controller 100 may transmit the first control signal CS1 at the first timing T1 of the first control loop CL1 and may transmit the second control signal CS2 at the second timing T2 of the second control loop CL2 subsequent to the loop CL1. The second timing T2 of the second control loop CL2 may correspond to the first timing T1 of the first control loop CL1. The first and second timings T1 and T2 may be start points of the respective control loops. In one embodiment, the first and second timing T1 and T2 may be an arbitrary time or another predetermined time within each control loop.

The timing estimator 220 may receive the first and second control signals CS1 and CS2 later than the first and second timing T1 and T2, due to the delay of the communication time. Thus, first and second delays d1 and d2 (e.g., delay times of the first and second signals) may be generated in the first and second signals, respectively. This may be a factor which degrades control performance in the control of the stage 300 (an example will be described with reference to FIG. 4).

Accordingly, in some embodiments, the timing estimator 220 may compensate the first and second delays d1 and d2 by estimating the first and second timings T1 and T2. For example, the timing estimator 220 may estimate the second timing T2 of the second control loop CL2, by receiving the first control signal CS transmitted at the first timing T1 and recognizing the first delay d1, which is the delay between the first timing T1 and the received timing of the first control signal CS. As a result, in the second control loop CL2 subsequent to the first control loop CL1, the timing estimator 220 may receive the second control signal CS2 and generate the second estimation signal ES2 at the estimated second timing ET2.

In one embodiment, a plurality of control loops may be before the second control loop CL2. The timing estimator 220 may average the delays of the received one or more control signals CS to estimate the transmission timing of the control signal of the subsequent control period. In one embodiment, timing estimator 220 may estimate the second timing T2, by recognizing the zero-th and the first delay d0 and d1 (which are delays generated in the zero-th and the first control loop CL0 and CL1) and averaging the zero-th and the first delay d0 and d1.

In FIG. 2, the estimated second timing ET2 is slightly different from the second timing T2. In one embodiment, the estimated second timing ET2 may be a timing that is substantially closer to or substantially identical to the second timing T2.

Figure 3:
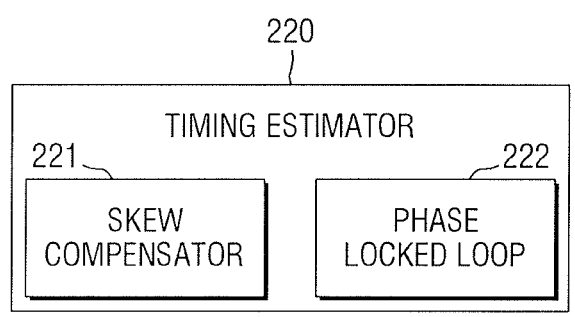
FIG. 3 illustrates an embodiment of a timing estimator.

Referring to FIG. 3, the timing estimator 220 may include a skew compensator 221 and a phase locked loop (PLL) 222. When the controller 100 transmits the control signal CS in the form of a clock signal, the timing estimator 220 may generate, for example, an estimation signal ES at the estimated timing using the skew compensator and the phase locked loop.

In one embodiment, the skew compensator may provide a second estimation signal ES2 earlier than a time after one control period from the timing at which the timing estimator 220 receives the first control signal CS1 by the first delay d1. Thus, the estimated second timing ET2 may approach the second timing T2 by compensating the second delay d2. In one embodiment, the skew compensator may be provided as another module including a logic element.

Another factor that may degrade control performance in control of the stage 300 is a jitter and beat frequency error. These may be reduced using a phase locked loop. The phase locked loop may reduce the jitter and beat frequency error by restoring the received clock signal to an accurate and stable frequency. Various embodiments will be described with reference to FIGS. 7 to 9.

Referring again to FIG. 1, the position estimator 230 may periodically sense the position information of the timing, that has not been sensed, based on the sensed position information SP from the sensor 210. Next, position information EP corresponding to the estimated position at the estimated timing (e.g., estimated second timing ET2) may be provided to the controller 100 based on the estimation signal ES of the timing estimator 220.

In some embodiments, the timing estimator 220 and the position estimator 230 may be mechanically connected to each other. In this case, delay may not occur in the estimation signal ES provided to the position estimator. The timing estimator and the position estimator are separate from each other in FIG. 1 and communicate with each other via the estimation signal. In some other embodiments, the timing estimator and the position estimator may be integrated into a single entity. In this case, the estimation signal may be omitted.

Periodic estimation of the position information of the timing that has not yet been sensed may be executed at the same period as the sensing period MP. In one embodiment, periodic estimation may be executed in a shorter period than the sensing period MP.

Figure 4:
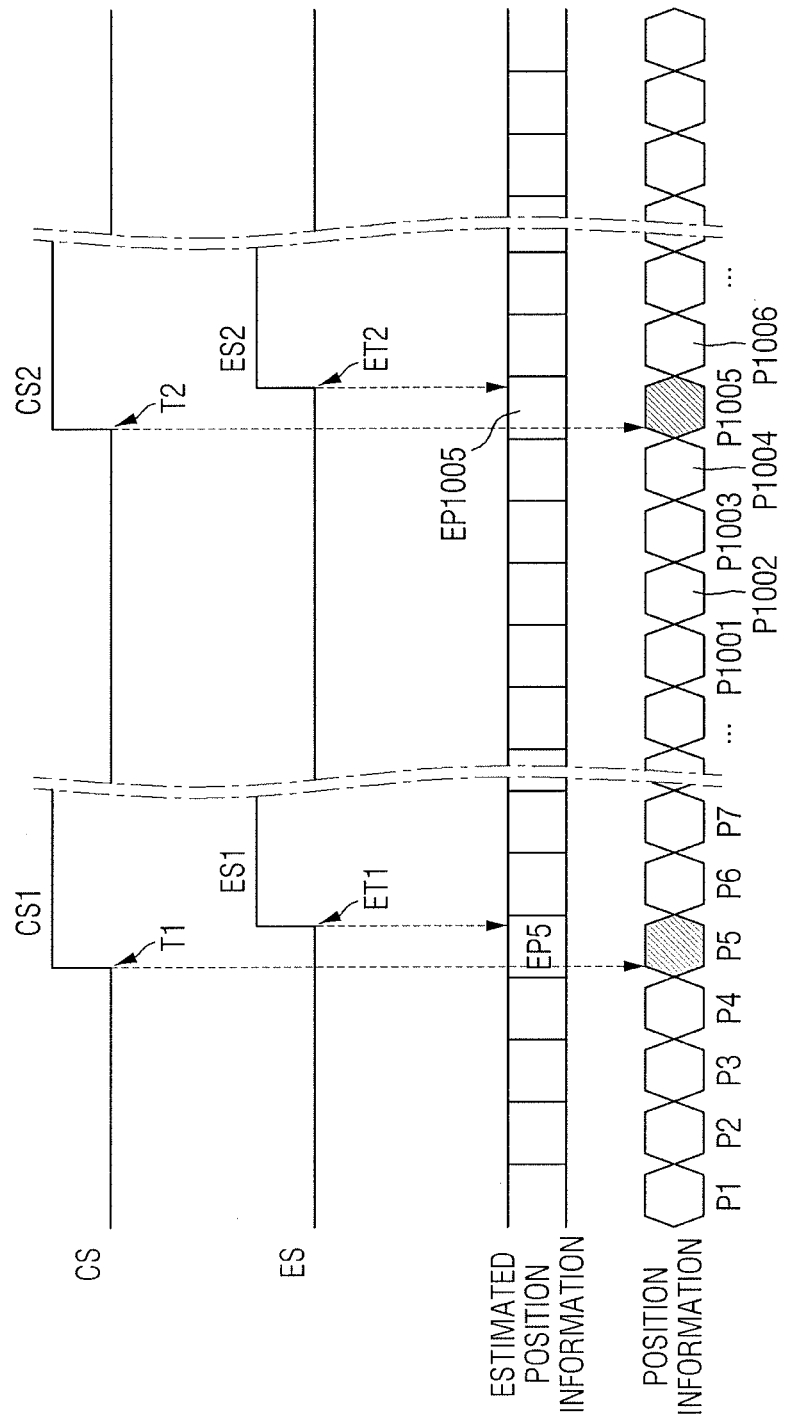
FIG. 4 illustrates an embodiment of a position estimator.

Referring to FIG. 4, in one embodiment, the position estimator (230 in FIG. 1) may estimate the position information P5 and P1005 at the first and second timings T1 and T2 before the first and second timings T1 and T2. The position estimator may generate the estimated position information EP5 and EP1005 in advance. Subsequently, the position estimator may provide the estimated position information EP5 and EP1005 to the controller 100 based on the first and second estimation signals ES1 and ES2 generated at the estimated first and second timings ET1 and ET2.

The position estimator 230 may estimate the position information of the timing, when not yet sensed, based on position information Pn (where, n is a natural number) that has been already sensed. The position information Pn is the position information of the wafer 400 sensed by the sensor 210 in a sensing period MP shorter than the control period CP of the controller 100.

The estimated position information EP5 may be estimated in advance, for example, based on interpolation and extrapolation to the position information (e.g., P1 to P3) sensed before the position information P5. In one embodiment, the position estimator 230 may generate the additional position information including the position, speed, acceleration or the like, of the wafer 400 of an arbitrary time before the recently sensed position information. This may be accomplished by interpolation into the sensed position information P1 to P3. Subsequently, the estimated position information EP5 may be generated in advance by estimating the position information P5 by extrapolation to the sensed position information P1 to P3 and the additional position information. Similarly, the estimated position information EP1005 may be estimated by extrapolation to the position information (e.g., P1001 to P1003) sensed before the position information P1005.

One example of an extrapolation method involves linear interpolation. According to this approach, when the position, speed, and/or acceleration of the time t0 are X0, VX0, and AX0, the position, speed, and/or acceleration X1, VX1, and AX1 of the time T1 may be estimated based on Equations 1 to 3. In one embodiment, the acceleration may be considered to be a constant. For convenience of explanation, the wafer may be assumed to move on a straight line.

$$X1 = X0 + V_{X0}(t - t0) + A_{X0}\frac{(t - t0)^2}{2} \quad (1)$$

$$V_{X1} = V_{X0} + A_{X0}(t - t0) \quad (2)$$

$$A_{X1} = A_{X0} \quad (3)$$

Extrapolation may be performed, for example, using linear interpolation as described above. In one embodiment, secondary interpolation, Lagrange interpolation, Newton interpolation, Hermite interpolation, or spline interpolation, may be used.

The position estimator 230 may calculate the estimated position information EP5 and EP1005, that are the position information of the estimated first and second timings ET1 and ET2, based on the first and second estimation signals ES1 and ES2. Subsequently, the calculated estimated position information EP5 and EP1005 may be provided to the controller 100 based on the position request signal RS of the controller 100. As a result, the position estimator 230 may estimate the position of the wafer 400 of the first and second timings T1 and T2 and may provide the estimated position information EP5 and EP1005 to the controller 100.

Figure 5:
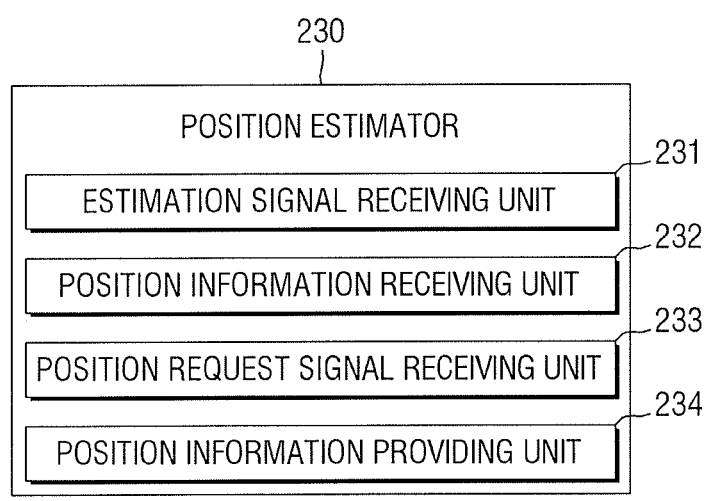
FIG. 5 illustrates an embodiment of a position estimator.
Figure 6:
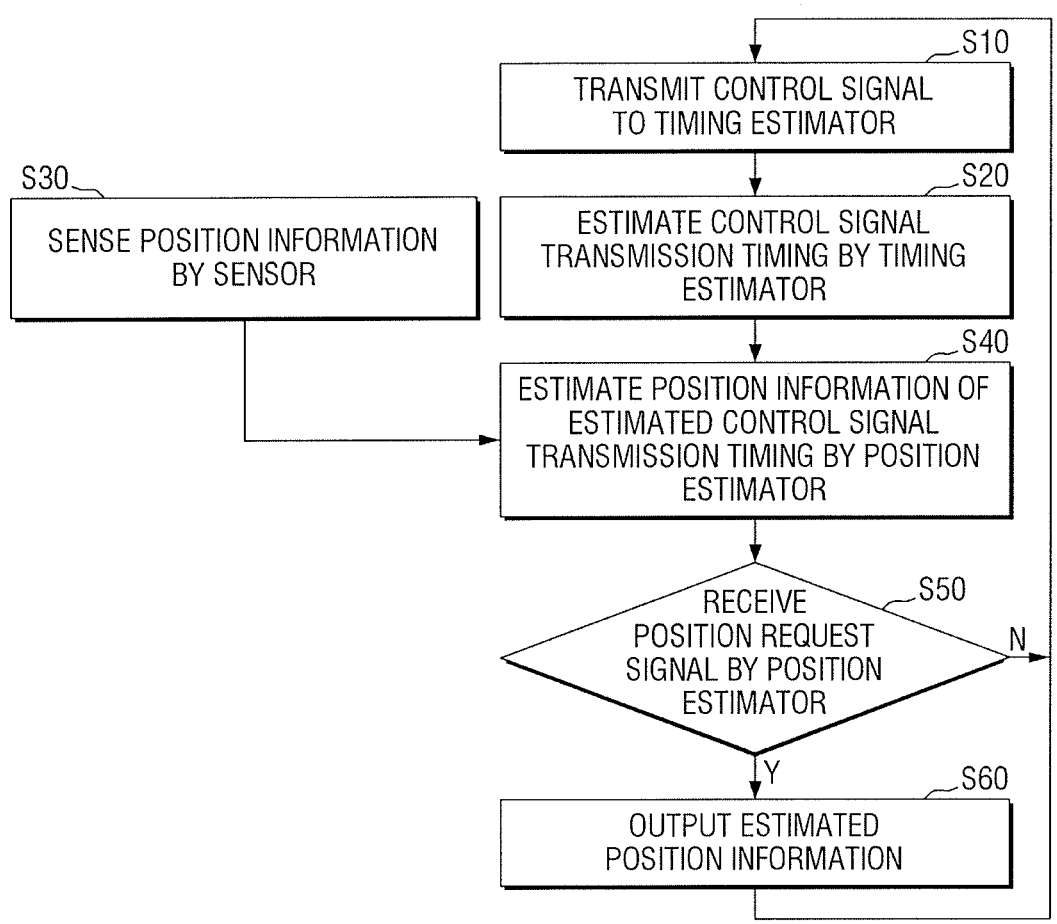
FIG. 6 illustrates an embodiment of a method for operating a metrology system.

Referring to FIG. 5, in one embodiment, the position estimator 230 may include an estimation signal receiving unit 231, a position information receiving unit 232, a position request signal receiving unit 233, and a position information providing unit 234. The estimation signal receiving unit 231 receives the estimation signal ES of the timing estimator 220, the position information receiving unit 232 receives the sensed position information SP from the sensor 210, the position request signal receiving unit 233 receives the position request signal RS of the controller 100, and the position information providing unit 234 may provide the estimated position information EP to the controller 100.

In the metrology system 200, the position request signal RS and the estimated position information EP may be transmitted in an asynchronous communication mode. The metrology system 200 may therefore be manufactured at a relatively low cost. In one embodiment, the position request signal RS and the estimated position information EP may also be transmitted in a synchronous communication mode. In one embodiment, metrology system 200 may control stage 300 for each control loop based on position information of the timing at which the controller 100 transmits the control signal, and control performance for stage control may be achieved by reducing jitter and bit frequency error.

Referring to FIGS. 1 to 6, in accordance with one or more embodiments, the metrology system may be operated as follows. In operation S30, sensor 210 senses position information and continuously provides the sensed position information SP to the position estimator 230. In operation S10, the timing estimator 220 transmits a control signal CS in each control loop (e.g., CL1). At this time, the sensing period MP of the sensor may be shorter than the control period CP of the control loop.

In subsequent operation S20, the timing estimator 220 estimates the transmission timing (e.g., T2 of FIG. 2) of the received control signal CS. As a result, in operation S40, the position estimator 230 estimates the position information of the wafer 400 at the estimated control signal CS transmission timing (e.g., ET2 of FIG. 2). The position information estimated as described above (e.g., EP5 of FIG. 2) may or may not be provided to the controller 100 according to the position request signal RS in the operation S50. For example, when the position estimator 230 receives the position request signal RS from the controller 100, the position estimator 230 may provide the estimated position information (e.g., EP5 of FIG. 2) to the controller 100. When the position estimator 230 does not receive the position request signal RS from the controller 100, the position estimator 230 may not provide the estimated position information (e.g., EP5 of FIG. 2) to the controller 100. In the subsequent control loop (e.g., CL2), the aforementioned operations may be repeated.

Figure 7:
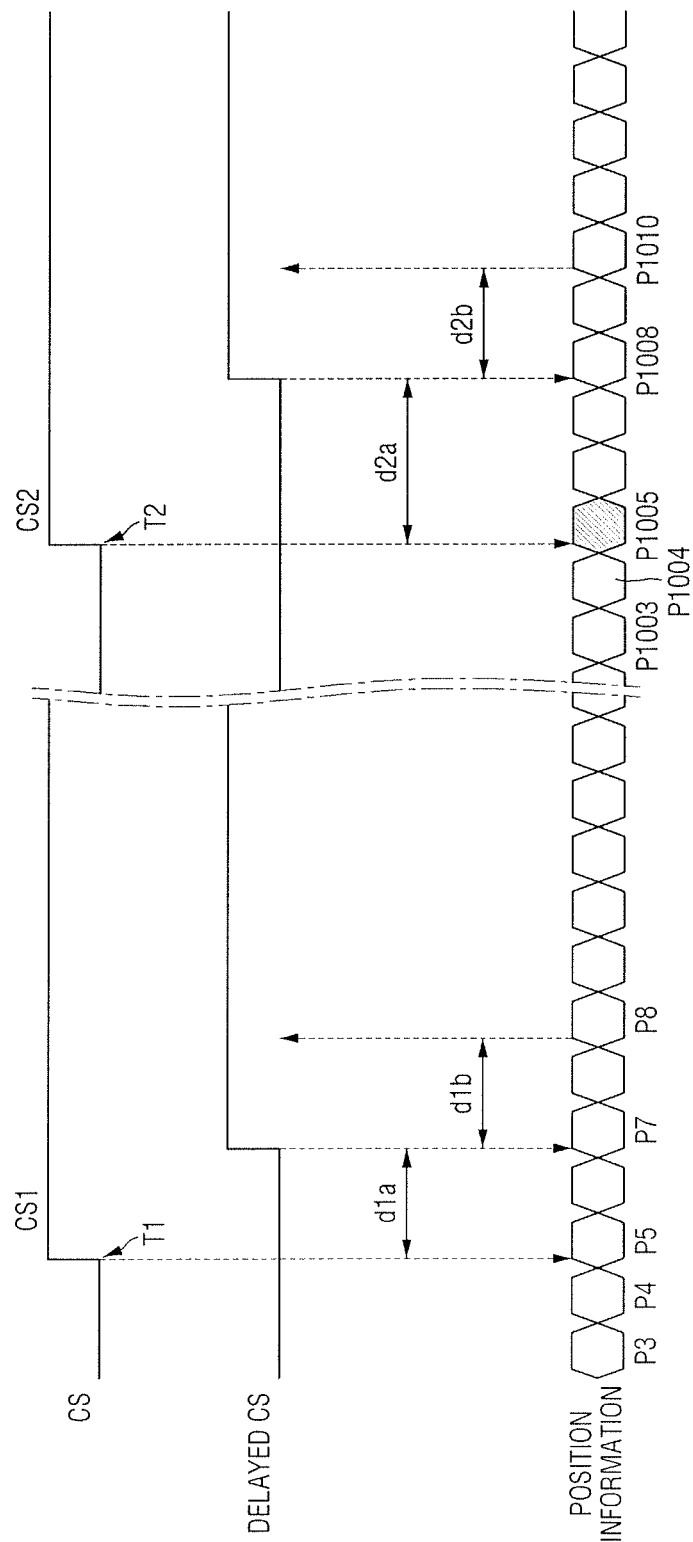
FIG. 7 illustrates an example of time errors.
Figure 8:
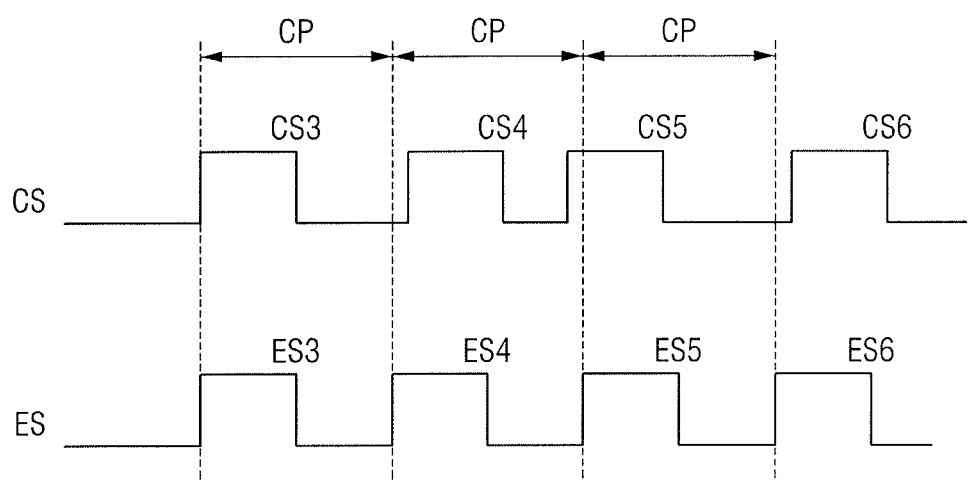
FIG. 8 illustrates an example of degradation in control performance.
Figure 9:
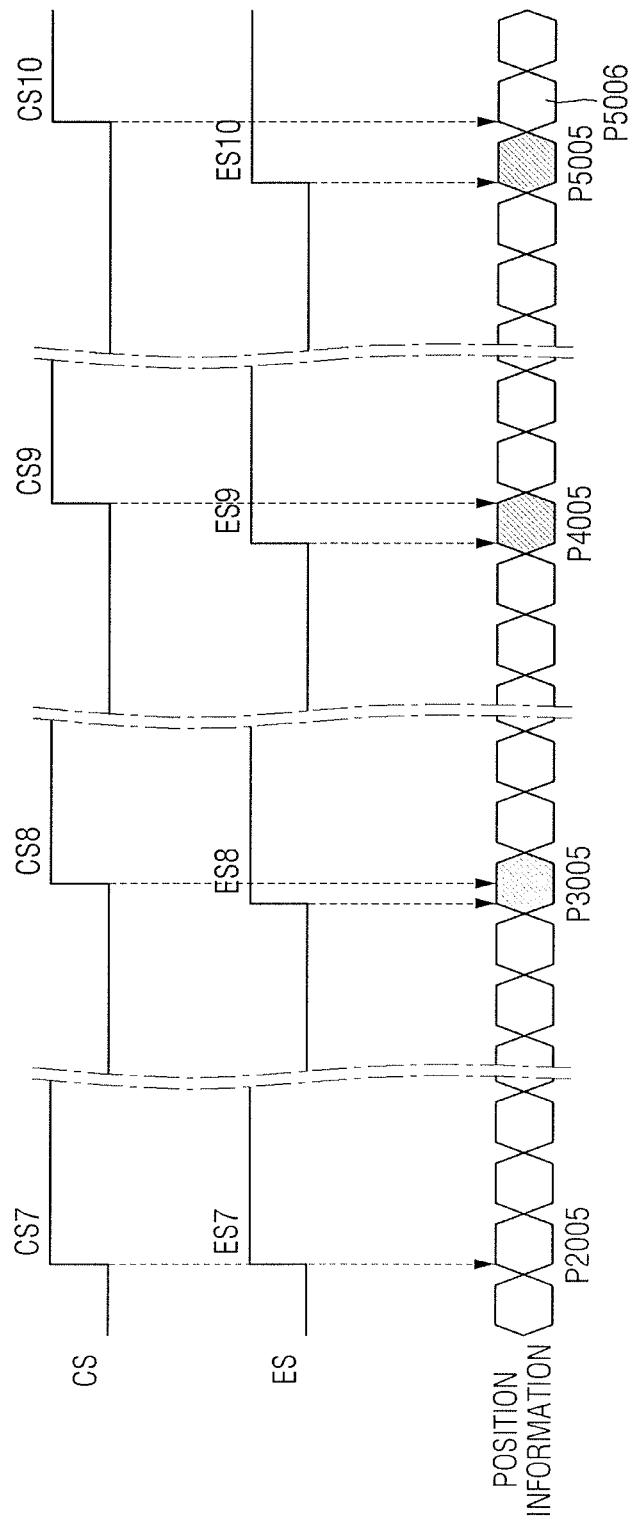
FIG. 9 illustrates another example of deterioration in control performance.

FIGS. 7 to 9 illustrate embodiments for performing stage control using one or more of the embodiments of the metrology system described herein. FIG. 7 illustrates an embodiment of a timing chart for explaining examples of errors that may occurs due to communication time between the controller and metrology system, the measurement time of the sensor, and the like. FIG. 8 illustrate an embodiment of a timing chart for explaining degradation of control performance based on jitter of the control signal. FIG. 9 illustrates an embodiment of a timing chart for explaining deterioration of control performance based on beat frequency error.

Referring to FIG. 7, controller 100 may request position information P5 and P1005, as the position information of wafer 400 at the first and second timings T1 and T2, based on the first and second control signals CS1 and CS2. Because of errors caused by the communication time between the controller 100 and metrology system 200, the position information of the wafer 400 provided to the controller 100 by the metrology system 200 may not be the position information P5.

For example, in FIG. 7, the first control signal CS1 may be delayed by the first communication delay d1a as the result of a communication delay between the controller 100 and metrology system 200. The metrology system 200 may provide the position information P7 to the controller 100. The first control signal CS1 may also be delayed by a first sensing delay d1b as the result of sensing delay for sensing of the sensor 210. The metrology system 200 may provide the position information P8 to controller 100. The second control signal CS2 may be delayed by a second communication delay d2a or may be further delayed by a second sensing delay d2*b*. Thus, controller 100 may receive provision of the position information P1008 or the position information P1010. In one embodiment, the first communication delay d1*a* and the first sensing delay d1*b* may be different from the second communication delay d2*a* and the second sensing delay d2*b*.

The error caused by such delays may degrade control performance of controller 100 that controls stage 300 for each control loop based on the position information at the timing for transmitting the control signal CS. Therefore, as described with reference to FIGS. 1 to 3, the metrology system 200 may estimate the timing for transmitting the control signal CS and provide the estimated position information of the estimated timing to the controller. For example, metrology system 200 may estimate the position of the wafer 400 at the first and second timing T1 and T2 and provide the estimated position information EP5 and EP1005 to the controller.

Thus, the metrology system 200 may improve, for example, performance of the controller 100 by precisely estimating and providing the position information of the wafer 400 at the timing requested by the controller 100, regardless of communication delay and sensing delay.

Referring to FIG. 8, even when the control signal CS does not include the delay of FIG. 7, the control signal CS transmitted by the controller may include jitter, that is a phenomenon in which the control signal is disturbed on a time axis. Even when there is no jitter in the control signal CS transmitted by the controller 100, electromagnetic interference generated in the process of communication between the controller 100 and the metrology system 200, crosstalk with other signals, and the like, may cause jitter in the control signal CS received by the metrology system 200. As a result, the metrology system 200 that receives the control signals CS3 to CS6 including the jitter may not sense the position of the wafer 400 at a constant control period CP for each control loop. Because the sensed position information includes non-constant errors, the sensed position information degrades control performance for the stage control. For example, non-constant errors may destabilize integral gain and differential gain calculation of the PID controller, and thus may degrade control performance of the controller.

In one embodiment, the estimation signal generated by the aforementioned timing estimator (220 of FIG. 1) may sense the position of wafer 400 at a substantially constant control period. For example, when the controller 100 transmits the control signal CS in the form of a clock signal, the timing estimator 220 may generate the estimation signals ES3 and ES6 at the substantially constant control period CP using a phase locked loop (PLL). Thus, metrology system 200 may provide sensed position information of wafer 400 to controller 100 at a substantially constant control period CP. The sensed position information may improve control performance for stage control.

Referring to FIG. 9, even when the control signal CS does not include the delay of FIG. 7 or the jitter of FIG. 8, position information directly provided by the control signal CS may include beat frequency error caused by a frequency difference between the controller 100 and sensor 210. For example, the controller 100 may control the stage 300 at the frequency of 10 KHz, and the sensor 210 may sense the position of the wafer 400 at the frequency of 10 MHz. Even in such a case, actual control frequency of the controller 100 may not be exactly 1000 times the sensing frequency of the sensor 210. For example, when the frequency of sensor 210 is 10 MHz, the control frequency of the controller 100 may be about 10.003 KHz. Such a frequency difference may cause a beat frequency error each time several control loops are repeated.

For example, as illustrated in FIG. 9, each of the control signals CS7 to CS9 may use the position information P2005, the position information P3005, and the position information P4005. The control signal CS10 may use position information P5006 other than position information P5005. Because position information with bit frequency errors may include non-constant errors, the position information may degrade control performance of the controller. For example, non-constant errors may destabilize integral gain and differential gain calculation of the PID controller and may degrade control performance of the controller.

In one embodiment, the estimation signal ES recovered by timing estimator 220 may reduce bit frequency error. For example, when controller 100 transmits the control signal CS in the form of a clock signal, the timing estimator 220 may recover the estimation signals ES7 to ES10 suitable for sensing frequency using the phase locked loop (PLL). As a result, estimation signals ES7 to ES10 may use position information P2005, the position information P3005, the position information P4005, and the position information P5005. Therefore, in one embodiment, metrology system 200 may provide the position information of wafer 400 with reduced bit frequency error to the controller 100. Such position information may improve control performance for stage control.

As a result, metrology system 200 according to some embodiments may control stage 300 for each control loop based on position information at the timing when the controller 100 transmits the control signal CS and may improve control performance for stage control by reducing jitter and bit frequency errors.

Figure 10:
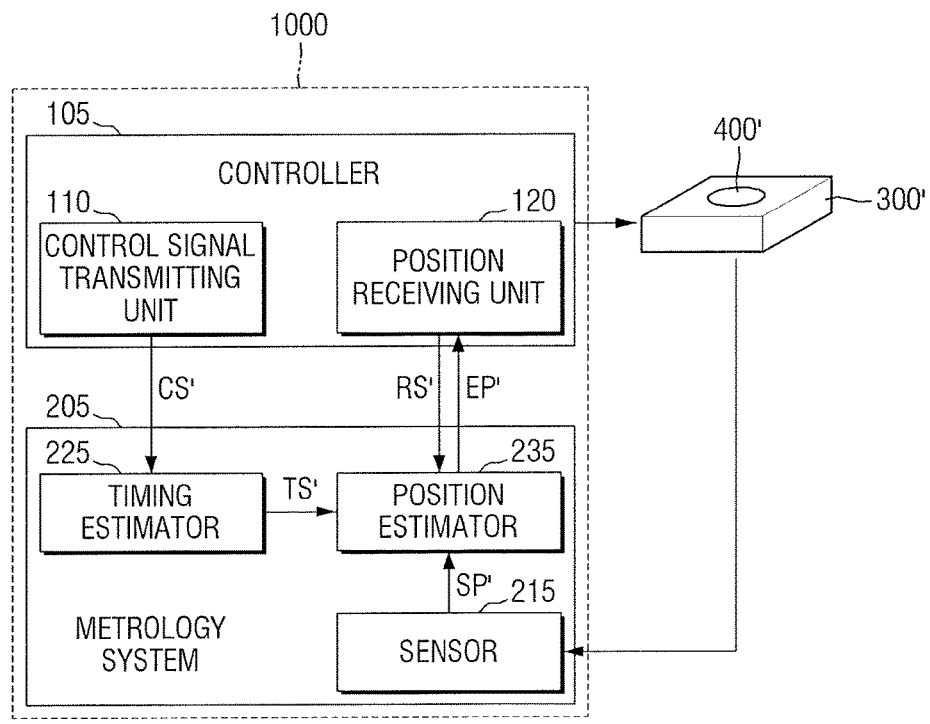
FIG. 10 illustrates an embodiment of a stage control device.

FIG. 10 illustrates an embodiment of a stage control device 1000 which includes a controller 105, and a metrology system 205. The metrology system 205 may include a sensor 215, a timing estimator 225 and a position estimator 235. The sensor 215, the timing estimator 225, and the position estimator 235 may correspond to the sensor 210, timing estimator 220, and position estimator 230 in FIG. 1.

In the stage control device according to some embodiments, the controller 105 may include a control signal transmitting unit 110. The control signal transmitting unit 110 may transmit the control signal CS' to the timing estimator 225 in each control loop. The control signal transmitting unit 110 may correspond, for example, to the configuration in which controller 100 of FIG. 1 transmits control signal CS' to the timing estimator 220 in each control loop. In the stage control device 1000 according to some embodiments, the control signal transmitting unit 110 may transmit control signal CS' in a synchronous communication mode. As a result, control signal CS' may be transmitted at a high transfer rate and high transmission efficiency. In one embodiment, control signal transmitting unit 110 may also transmit control signal CS' in an asynchronous communication mode.

In the stage control device according to some embodiments, the controller 105 may include the control signal transmitting unit 110 and the position receiving unit 120. The position receiving unit 120 may receive the estimated position information EP' from position estimator 235. For example, position receiving unit 120 may correspond to the configuration in which controller 100 of FIG. 1 receives the position information EP estimated by the position request signal RS. In one embodiment, position receiving unit 120 may periodically receive the estimated position information EP without transmission of the position request signal RS'. For example, position estimator 235 may not receive the position request signal RS' from the position receiving unit 120 of the controller 105 and may periodically provide the estimated position information EP' to the position receiving unit 120 for each control loop. In one embodiment, the position receiving unit 120 may also receive the estimated position information EP' based on the position request signal RS'.

In the stage control device 1000 according to some embodiments, the position estimator 235 may receive the estimated position information EP in a synchronous communication mode. As a result, the estimated position information EP' may be provided at a high transfer rate and high transmission efficiency. In one embodiment, position estimator 235 may also receive the estimated position information EP in an asynchronous communication mode.

The stage control device 1000 according to some embodiments may therefore control stage 300' for each control loop based on the position information when controller 105 transmits the control signal CS and may improve control performance of the controller 105 by reducing jitter and bit frequency errors.

Figure 11:
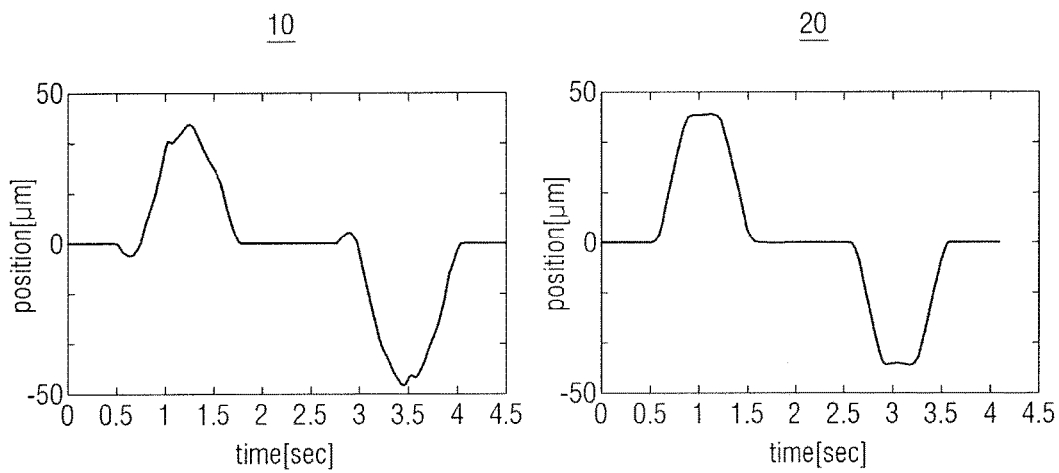
FIG. 11 illustrates an embodiment in which positions of a wafer are recorded with respect to time.

FIG. 11 illustrates an example of graphs 10 and 20 for wafer positions recorded over time based on a command input to different stage controllers. Referring to FIG. 11, graph 10 illustrates a case of a stage control device using a metrology system which does not use timing estimator 220 and position estimator 230 in the metrology system 200 of FIG. 11. Graph 20 illustrates a case of a stage control device 1000 according to one or more of the previously described embodiments. In the graphs 10 and 20, each stage control device is ordered to locate wafer 400 in a positive (+) direction within 0.5 seconds to 1.5 seconds and to locate the wafer 400 in a negative (−) direction within 2.5 seconds to 3.5 seconds.

Graph 10 exhibits a rolling shape around 0.5 seconds and 3 seconds and has a wavy shape in a section where a command is input. Thus, graph 10 exhibits a level of control stability that is inferior to the graph 20.

Further, since the time for reaching the target point from the time of the command input is 0.5 seconds or less, graph 20 exhibits a control speed faster than the graph 20 of about 0.5 seconds. For example, stage control device 1000 may provide improved control performance in terms of control stability and control speed.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, estimators, units, and other data and signal generating and processing features of the embodiments disclosed herein may be implemented in logic which, for example, may include hardware, software, or both. When implemented at least partially in hardware, the controllers, estimators, units, and other data and signal generating and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, estimators, units, and other data and signal generating and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A metrology system, comprising:
a timing estimator to receive a control signal transmitted at a first timing of a first control loop and to estimate a second timing at which the control signal is transmitted in a second control loop subsequent to the first control loop;
a sensor to sense position information of a wafer; and
a position estimator to estimate the position information of the wafer at the estimated second timing based on the sensed position information of the wafer and to output the estimated position information of the wafer based on a position request signal.

2. The metrology system as claimed in claim 1, wherein:
the timing estimator is to receive the control signal in a synchronous communication mode, and
the position estimator is to output the estimated position information of the wafer in an asynchronous communication mode.

3. The metrology system as claimed in claim 1, wherein each of the first and second timings corresponds to a start point of the first and second control loops.

4. The metrology system as claimed in claim 1, wherein the timing estimator is to estimate the second timing based on a plurality of control signals from control loops before the second control loop.

5. The metrology system as claimed in claim 4, wherein:
the timing estimator is to receive the control signal as a clock signal, and
the timing estimator is to estimate the second timing using a skew compensator and a phase locked loop (PLL).

6. The metrology system as claimed in claim 1, wherein the sensor is to sense the position information of the wafer at a period shorter than the periods of the first and second control loops.

7. The metrology system as claimed in claim 6, wherein the position estimator is to generate additional position information by interpolation into the sensed position information of the wafer and is to estimate the position information of the wafer at the estimated second timing by extrapolation into the position information and the additional position information.

8. A stage control device, comprising:
a sensor to sense a position of a wafer on a stage and to transmit sensed position information in a synchronous communication mode;
a controller including a control signal transmitter to transmit a first control signal at a first timing within a first control loop and a second control signal at a second timing within a second control loop subsequent to the first control loop;
a timing estimator to receive the first control signal and estimate the second timing at which the second signal is transmitted to transmit an estimation signal at the estimated second timing; and
a position estimator to receive the sensed position information from the sensor, estimate the position of the wafer at the second timing based on the estimation signal, and provide the estimated position information to the controller, wherein the controller is to control the stage based on the estimated position information.

9. The stage control device as claimed in claim 8, wherein:
the controller includes a position receiving unit to transmit a position request signal to the position estimator, and
the position estimator is to provide the estimated position information to the position receiving unit based on the position request signal.

10. The stage control device as claimed in claim 9, wherein the estimated position information includes position information of the wafer at the estimated second timing, which is prior to the timing of the position request signal.

11. The stage control device as claimed in claim 9, wherein:
the signal transmitter is to transmit the first and second control signals in a synchronous communication mode, and
the position receiving unit is to transmit the position request signal in an asynchronous communication mode and receive the estimated position information.

12. The stage control device as claimed in claim 8, wherein the timing estimator is to recognize delay of the first control signal and estimate the second timing.

13. The stage control device as claimed in claim 12, wherein:
the signal transmitter is to transmit the first and second control signals as a clock signal, and
the timing estimator is to estimate the second timing using a skew compensator and a phase locked loop.

14. The stage control device as claimed in claim 8, wherein the sensor is to sense the position information of the wafer at a period shorter than the periods of the first and second control loops.

15. The stage control device as claimed in claim 14, wherein:
the position estimator is to generate additional position information by interpolation into the sensed position information, and
the position estimator is to estimate the position information of the wafer at the second timing by extrapolation into the position information and the additional position information.

16. A system, comprising:
first logic to receive a control signal transmitted at a first timing of a first control loop and to estimate a second timing at which the control signal is transmitted in a second control loop subsequent to the first control loop; and
second logic to estimate a position information of a wafer at the estimated second timing based on sensed position information of the wafer, the second logic to output the estimated position information based on a position request signal.

17. The system as claimed in claim 16, wherein:
the first logic is to receive the control signal in a synchronous communication mode, and
the second logic is to output the estimated position information of the wafer in an asynchronous communication mode.

18. The system as claimed in claim 16, wherein the first and second timings correspond to start points of the first and second control loops, respectively.

19. The system as claimed in claim 16, wherein the first logic is to estimate the second timing based on a plurality of control signals from control loops before the second control loop.

20. The system as claimed in claim 16, wherein the second logic is to:
generate additional position information by interpolation into the sensed position information of the wafer, and
estimate the position information of the wafer at the estimated second timing by extrapolation into the position information and the additional position information.

* * * * *